(12) United States Patent
Hou et al.

(10) Patent No.: US 7,016,166 B1
(45) Date of Patent: Mar. 21, 2006

(54) MAG-TAB DESIGN FOR BIASING MAGNETIC SENSORS

(75) Inventors: Chunhong Hou, Savage, MN (US); Xuefei Tang, Eden Prairie, MN (US); Qing He, Plymouth, MN (US); Lei Wang, Apple Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 32 days.

(21) Appl. No.: 10/406,172

(22) Filed: Apr. 3, 2003

Related U.S. Application Data

(60) Provisional application No. 60/417,469, filed on Oct. 10, 2002.

(51) Int. Cl.
G11B 5/127 (2006.01)
(52) U.S. Cl. .................................................. 360/324.12
(58) Field of Classification Search .......... 360/324.12, 360/324.11, 324.2, 327.1, 327.3, 327.31, 360/327.32
See application file for complete search history.

(56) References Cited

U.S. PATENT DOCUMENTS

| | | | |
|---|---|---|---|
| 4,103,315 A | 7/1978 | Hempstead et al. | |
| 5,508,866 A | 4/1996 | Gill et al. | |
| 5,528,440 A | 6/1996 | Fontana et al. | |
| 5,739,987 A * | 4/1998 | Yuan et al. | 360/327.32 |
| 5,742,162 A * | 4/1998 | Nepela et al. | 324/252 |
| 5,869,963 A * | 2/1999 | Saito et al. | 324/252 |
| 5,883,764 A | 3/1999 | Pinarbasi | |
| 5,893,981 A * | 4/1999 | Dovek et al. | 216/22 |
| 6,023,395 A * | 2/2000 | Dill et al. | 360/324.2 |
| 6,061,211 A * | 5/2000 | Yoda et al. | 360/324.12 |
| 6,074,767 A | 6/2000 | Lin | 428/692 |
| 6,210,810 B1 | 4/2001 | Ikarashi et al. | 428/611 |
| 6,238,531 B1 * | 5/2001 | Pinarbasi | 204/298.04 |
| 6,324,037 B1 * | 11/2001 | Zhu et al. | 360/324.12 |
| 6,330,136 B1 * | 12/2001 | Wang et al. | 360/324.2 |
| 6,385,018 B1 * | 5/2002 | Mukoyama | 360/324.12 |
| 6,501,626 B1 * | 12/2002 | Gill | 360/324.11 |
| 6,556,391 B1 * | 4/2003 | Aoshima et al. | 360/324.12 |
| 6,570,745 B1 * | 5/2003 | Gill | 360/324.12 |
| 6,636,400 B1 * | 10/2003 | Pinarbasi et al. | 360/324.12 |
| 6,650,513 B1 * | 11/2003 | Fullerton et al. | 360/324.2 |
| 6,700,750 B1 * | 3/2004 | Hasegawa | 360/314 |
| 6,704,176 B1 * | 3/2004 | Shukh et al. | 360/324.12 |
| 6,704,177 B1 * | 3/2004 | Morinaga et al. | 360/324.12 |
| 6,707,647 B1 * | 3/2004 | Gill et al. | 360/320 |
| 6,724,586 B1 * | 4/2004 | Gill | 360/324.2 |
| 6,765,768 B1 * | 7/2004 | Saito | 360/319 |
| 6,785,103 B1 * | 8/2004 | Cornwell et al. | 360/324.12 |
| 6,813,121 B1 * | 11/2004 | Pinarbasi | 360/322 |
| 6,879,474 B1 * | 4/2005 | Chien et al. | 360/324.12 |
| 2002/0015268 A1 * | 2/2002 | Mao et al. | 360/324.12 |
| 2002/0154458 A1 * | 10/2002 | Lin et al. | 360/324.12 |
| 2005/0068696 A1 * | 3/2005 | Chau et al. | 360/324.12 |

* cited by examiner

*Primary Examiner*—Allen Cao
(74) *Attorney, Agent, or Firm*—Kinney & Lange, P.A.

(57) ABSTRACT

A structure for stabilizing the active region of the magnetic sensor comprises a hard ferromagnetic element adjacent to a biasing multilayer element placed on either side of the active region of the magnetic sensor. The biasing multilayer element includes soft ferromagnetic and anti-ferromagnetic layers such that the biasing strength applied to the active region of the magnetic sensor is tuneable by adjusting the length of the soft ferromagnetic layer or layers as well as the insertion of spacer layers between the soft ferromagnetic materials and the anti-ferromagnetic layers. The inventive structure provides longitudinal bias to the active region with improved domain control, signal amplitude and side-reading properties.

20 Claims, 2 Drawing Sheets

MAG-TAB DESIGN FOR BIASING MAGNETIC SENSORS

CROSS-REFERENCE TO RELATED APPLICATION(S)

This application claims priority from Provisional Application No. 60/417,469 filed Oct. 10, 2002 for MAG-TAB DESIGN FOR BIASING MAGNETIC SENSORS of Chunhong Hou, Xuefei Tang, Qing He and Lei Wang.

BACKGROUND OF THE INVENTION

The present invention generally relates to the stabilization of the active region of a magnetic sensor for the prevention of Barkhausen noise. More specifically, the invention relates to control of the domains at the ends of the sensing layer without reductions in signal amplitude, while preventing side-reading, thereby enhancing the operation of magnetoresistive sensors.

In the most general terms, a magnetic sensor has an active region containing a sensing layer. The sensing layer is typically a soft ferromagnetic material that responds to changes in magnetic flux. The presence of magnetic flux causes the domains within the soft magnetic material to align with the magnetic field. Therefore, it is desirable for the domains in the sensing layer to have the freedom to rotate with changes in direction and density of magnetic flux.

The changes in magnetic flux are detected through the use of an electric current passing through the sensing layer. As the sensing layer responds to changes in the magnetic flux, the electrical properties of the material in the sensing layer also change. This change is measured and converted into data signals.

Magnetic sensors are used to read data stored in the form of magnetic flux on magnetic media material, for example hard discs. The magnetic flux is stored in organized regions such that the hard disc is divided into tracks, which are subdivided into bit fields. The magnetic media material within each bit field is magnetized with a particular anisotropy. It is the changes in the directionality of the magnetic flux between bit fields that is detected by the magnetic sensor and consequently converted into data.

As a magnetic sensor reads the magnetic flux from a disc, it is critical that the sensor read only one bit field at a particular moment in time. The detection of additional magnetic flux from adjacent tracks or adjacent bit fields leads to errors in the data. Therefore, magnetic sensors commonly include shields to isolate the active region of the sensor from the adjacent bit fields within a track. Magnetic sensors rely on other methods to avoid reading signals from adjacent tracks.

In order to prevent side-reading, conventional magnetic media are usually organized to create guard bands where no flux is stored, in between adjacent tracks, thereby preventing the magnetic flux from reaching the sensor's active region. The use of guard bands limits track density. As demand for higher storage density increases, it is desirable to either reduce or eliminate the need for empty guard band spaces. Therefore, when developing magnetic sensor designs for use with high density media, it is becoming more necessary to consider the ability of magnetic sensors to prevent side-reading.

Another consideration for magnetic sensor design is proper biasing for sensor operation. Magnetoresistive (MR) or giant magnetoresistive (GMR) sensors utilize an MR or GMR element to read magnetically encoded information from a magnetic medium, such as a disc, by detecting magnetic flux stored on the magnetic medium. The MR element, comprising at least one MR layer, has magnetoresistive properties and generates an output voltage when a sense current flows through the MR layer. An MR sensor must contain both longitudinal bias and transverse bias to maintain the sensor in its optimal operating range so that it can properly detect the magnetic flux, while a GMR sensor may not need the transverse bias field, requiring only the longitudinal bias field. The longitudinal bias field serves to suppress Barkhausen noise due to formation of a large number of magnetic domains in the ferromagnetic layer, thereby obtaining a smooth and low-noise resistance change in response to the magnetic flux from the magnetic media. The dual biasing is established through various combinations of exchange or magnetostatic biasing schemes.

MR or GMR elements can "fracture" into multiple magnetic domains when they are exposed to an external magnetic field. To maximize the stability and output of the MR or GMR sensor, it is desirable to maintain the MR element in a single domain state. Three methods for maintaining the MR or GMR element in a single domain state are magnetostatic coupling, ferromagnetic exchange coupling and anti-ferromagnetic exchange coupling. Magnetostatic coupling is accomplished by positioning a permanent magnet adjacent to the MR or GMR element. Exchange coupling is accomplished by depositing a ferromagnetic or anti-ferromagnetic layer adjacent to the MR layer so that one of the magnetic lattices of the magnetic layer couples with the magnetic lattice of the MR layer to preserve the single domain state of the sensor.

Different stabilization schemes have been employed in prior art sensor structures to provide longitudinal bias for the control of the domain structure at the ends of the MR layer or active region. One method of stabilization is uniform pinning across the entire active region of the sensor by placement of an anti-ferromagnetic layer. The uniform pinning of the active region over the whole sensor has the advantage of easy processing, but reduces sensor efficiency due to a reduction in signal amplitude because of strong pinning at the center part of the active region. The need to pin the domain structure of the MR layer, particularly at the ends, to suppress noise directly competes with the desired freedom in domain movement that is required at the central portion of the MR layer in order to achieve detectable signal amplitudes. Pinning of the MR layer using a uniform stabilization across the MR element suppresses the signal amplitude, while at the same time, the pinning strength at the ends of the MR layer may not be strong enough to control domain movement. This results in the negative combination of more noise and less signal.

Another method of stabilization is to place an anti-ferromagnetic layer at or on each end of the active region. The anti-ferromagnetic layer provides biasing to pin the ends of the MR layer thereby decreasing Barkhausen noise. This method is also referred to as exchange tab stabilization. This method seems to successfully provide biasing to only the ends of the active region while leaving the center area of the sensor unpinned and capable of large signal response. However, the pinning strength at the end of the active regions may not be large enough or strong enough to maintain a single domain within the active region. Additionally, the exchange tab stabilization is not magnetically stiff enough to prevent side reading.

The predominant type of stabilization, currently used in conventional sensors, is the incorporation of permanent magnets at the two ends of the MR element. The permanent magnets provide sufficient pinning strength to reduce the noise by controlling domain movement and to define a good track width. However, the magnetic field from the permanent magnets can penetrate into the active region of the sensor making it inactive. This negatively affects signal amplitude. This problem with permanent magnet stabilization has increased as the active region size decreases in response to higher media densities. Sensors stabilized by permanent magnets tend to be very rigid in response, as well as resulting in smaller signal amplitude.

Therefore, there is a continuing need in the art for a stabilization scheme that can provide domain control of the active region for the reduction of noise while simultaneously allowing magnetic freedom in the center of the active region for large signal amplitude while reducing side reading.

BRIEF SUMMARY OF THE INVENTION

A structure for stabilizing a magnetic sensor, which includes a biasing multilayer element having a first end and a second end, wherein the first end abuts the active region of the magnetic sensor. A hard ferromagnetic element is located adjacent to the second end of the biasing multilayer element and spaced from the active region. The biasing multilayer in combination with the hard ferromagnetic element provides domain stabilization of the active layer within the magnetic sensor while reducing side-reading and signal amplitude penalties.

DETAILED DESCRIPTION

Figure 1:
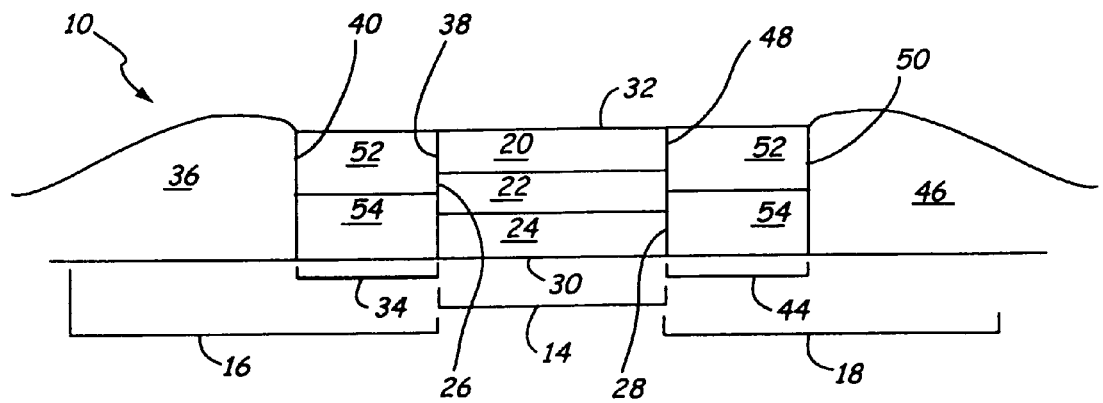
FIG. 1 is a sectional view of the reader portion of a magnetoresistive sensor consistent with the present invention.

The stabilization structure of the present invention may be used with various types of magnetic sensors, including but not limited to: MR, GMR and spin valve. An MR or GMR sensor 10 consistent with the present invention is shown in FIG. 1. The MR or GMR sensor 10 includes: a central region 14, a first biasing structure 16 and a second biasing structure 18. The MR or GMR sensor will also include the following additional structures which are not shown in FIG. 1: one or more contacts, and one or more shields (e.g. top and bottom shields) according to the specific sensor design.

The central region 14 of a MR or GMR sensor 10 is generally a multilayer structure wherein one or more layers are magnetically active and free to respond to changes in magnetic flux. This type of layer is commonly called a free layer or MR layer, and although referred to as a singular layer, the teachings of the present invention are also applicable to sensor designs incorporating multiple MR or GMR layers. Other layers within the central region may include, but are not limited to, spacer layers, pinned layers, and pinning layers. A wide variety of configurations are known with variance in the order, composition, number and thickness of layers within the central region. One example configuration, as seen in FIG. 1, a simple GMR structure, for the central region 14 includes free layer 20, spacer 22 and pinned layer 24. The pinned layer 24 can be replaced with a tri-layer structure of ferromagnet/metal/ferromagnet, which is often referred as synthetic antiferromagnet (SAF) structure. The SAF has the two ferromagnetic layer antiparallel coupled through the metal layer like ruthenium (Ru). One or more seed layers or pinning layers may also be included, but are not shown in FIG. 1. The central region 14 may also be considered part of an MR or GMR element.

The central region 14 as shown in FIG. 1 has four sides, a first side 26, a second side 28, a bottom 30 and a top 32. The width of the central region from the first side 26 to the second side 28 will generally relate to the track width. First side 26 and second side 28 may also be referred to as junctions. The first biasing structure abuts the first side 26 of central region 14. Similarly, the second biasing structure 18 abuts the second side 28 of the central region 14.

The first and second biasing structures, 16 and 18 respectively, are generally mirror images of each other placed on alternate sides of the central region 14 as described above. The first biasing structure 16 comprises a first biasing multilayer 34 and a first hard bias element 36. The second biasing structure 18 comprises a second biasing multilayer 44 and a second hard bias element 46.

The first biasing multilayer 34 has a proximal side 38 and a distal side 40. The proximal side 38 of the first biasing multilayer 34 abuts the first side 26 of central region 14. The distal side 40 of the first biasing multilayer 34 abuts the first hard bias element 36. This results in the first biasing multilayer 34 separating the central region 14 from the first hard bias element 36.

The second biasing multilayer 44 has a proximal side 48 and a distal side 50. The proximal side 48 of the second biasing multilayer 44 abuts the second side 28 of central region 14. The distal side 50 of the second biasing multilayer 44 abuts the second hard bias element 46. This results in the second biasing multilayer 44 separating the central region 14 from the second hard bias element 46.

Figure 2:
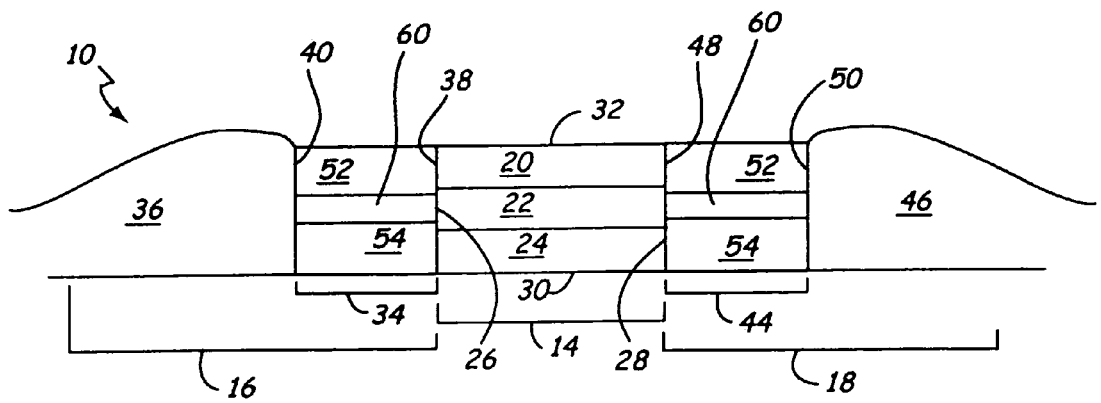
FIG. 2 shows an alternative embodiment of an MR sensor consistent with the present invention.
Figure 3:
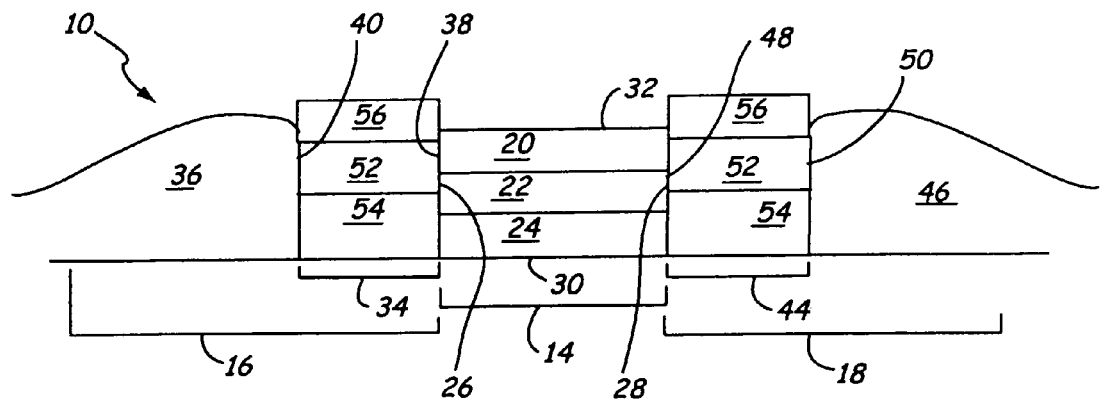
FIG. 3 shows another alternative embodiment of an MR sensor consistent with the present invention.

The first and second biasing multilayers, 34 and 44 respectively, comprise at least two layers where at least one layer is a soft ferromagnetic layer 52 and at least one layer is an anti-ferromagnetic layer 54. The soft ferromagnetic layer 52 is exchange coupled to the anti-ferromagnetic layer 54 or otherwise pinned to provide the desired anisotropy. Alternatively, first and second biasing multilayers, 34 and 44 respectively, may additionally comprise a spacer layer 60 between a soft ferromagnetic layer 52 and an anti-ferromagnetic layer 54 as shown in FIG. 2. In another alternative embodiment, the first and second biasing multilayers, 34 and 44 respectively, may comprise a first anti-ferromagnetic layer 54, a soft ferromagnetic layer 52, and a second anti-ferromagnetic layer 56 as shown in FIG. 3. This embodiment may also additionally comprise spacer layers (not shown). Additional embodiments include first and second biasing multilayers comprising two or more soft ferromagnetic layers layered with one or more anti-ferromagnetic layers and may optionally include spacer layers.

The inventive biasing structures (16 and 18 as described above) of the present invention each comprise a biasing multilayer (34 and 44 as described above) and a hard bias element (36 and 46 as described above). The biasing multilayer in combination with the hard bias element stabilizes the central region 14 of the MR or GMR sensor 10. More specifically, the biasing multilayer and hard bias element function together to provide sufficient longitudinal bias to stabilize the MR layer 20 of the central region 14 of MR or GMR sensor 10.

There are competing factors that must be considered when stabilizing the domain structure of the active region, including one or more MR layers of a MR or GMR sensor. To suppress Barkhausen noise, it is required to make the MR layer or layers into the form of a single domain. This requires the application of a sufficiently strong longitudinal bias. However, the MR layer must be free to rotate with the changing magnetic flux from the magnetic media. Therefore, if too strong of longitudinal bias is applied to the MR layer and active region of the sensor, rotation is suppressed. Signal amplitude is reduced, thereby impairing the separation of detected signal from background noise and further leading to an increase in data errors.

As discussed previously, conventional multilayer biasing structures, such as the exchange tab structures used to provide longitudinal bias allow for good signal amplitude by allowing for mobility throughout the MR layer, including at the ends adjacent to the exchange tab structures. However, these structures fail to provide sufficient longitudinal biasing strength to maintain a single domain structure within the MR layer. Additionally, these types of structures are magnetically soft so that the structures themselves respond to magnetic flux from the magnetic media. In addition to the noise generated by not confining signal response to the MR layer, side-reading also becomes a problem. The exchange tab structures are not magnetically stiff enough to provide sufficient shielding to prevent penetration of stray magnetic flux into the active region of the magnetic sensor from the adjacent tracks.

In contrast, longitudinal bias provided by conventional permanent magnet (hard bias) biased structures readily controls the domain structure. The problem is that the hard bias materials provide too strong of a longitudinal bias. The overkill in applied bias strength makes the sensing layer inactive. Consequently, the problem of reduced signal amplitude is exacerbated by the decreasing size of the active region with increases in magnetic media storage density.

The longitudinal biasing structure of the present invention solves the problems of poor domain control and side-reading without sacrificing signal amplitude. The biasing structure of the present invention provides more longitudinal biasing strength than conventional exchange tab structures, thereby improving domain control and decreasing Barkhausen noise. Additionally, the inventive biasing structures provide improved side-shielding over conventional exchange tab structures. The MR layer of the present inventive structure has improved mobility compared to conventional permanent magnet biased MR layers by reducing the field penetrated into the sensing layer. The influence of the hard bias in the inventive structure, while still present to strengthen domain control, is moderated to allow for improved signal amplitude compared to conventional permanent magnet biasing.

Another benefit of the longitudinal biasing structures of the present invention is the ability to "tune" the biasing strength to achieve the desired balance between reduction of Barkhausen noise and signal amplitude. There are several different options that may be used singly or in combination to tune the biasing strength of the inventive structure.

First, the multilayer biasing structure may be modified. The number and composition of the layers may be changed to alter the longitudinal biasing strength, for example see the embodiment shown in FIG. 3. Also, spacers 60 may be introduced between the soft ferromagnetic layers and the anti-ferromagnetic layers to modulate the exchange coupling strength of those layers to each other as shown by the embodiment of FIG. 2.

Second, spacers (not shown) may be placed at the junctions between the proximal side 38 of the first biasing multilayer 34 and the first side 26 of the central region 14 and between the proximal side 48 of the second biasing multilayer 44 and the second side 28 of the central region 14.

Figure 4:
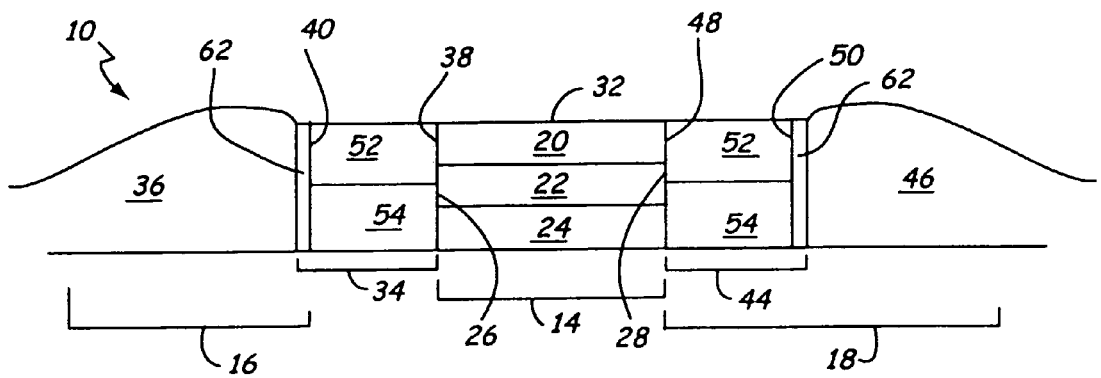
FIG. 4 shows another additional alternative embodiment of an MR sensor consistent with the present invention.

Third, spacers 62 may optionally be placed between the distal side 40 of the first biasing multilayer 34 and the hard bias element 36 and between the distal side 50 of the second biasing multilayer 44 and hard bias element 46 as shown in FIG. 4.

The fourth and final option is to adjust the size of the biasing multilayers. By reducing the width of the biasing multilayers 34 and 44, the hard bias elements 36 and 46 are brought closer to the central region 14, consequently increasing the longitudinal biasing strength exerted on the MR layer 20. If the biasing multilayers 34 and 44 are made wider and/or spacers are introduced as described in the second and third options above, the hard bias elements 36 and 46 are further distanced from the central region 14, thereby increasing signal amplitude.

Although the present invention has been described with reference to MR or GMR sensors used in hard disc drives and example sensor structures were provided, workers skilled in the art will recognize that changes may be made in form and detail without departing from the spirit and scope of the invention.

The invention claimed is:

1. A structure for stabilizing a magnetic sensor having a central region, the structure comprising:
   a biasing multilayer element having at least two layers that extend from a first end to a second end of the multilayer element, wherein the at least two layers at the first end abut the central region; and
   a hard bias element adjacent to the second end of the biasing multilayer element and spaced from the central region.

2. The structure of claim 1 wherein the biasing multilayer element comprises at least one pinned soft ferromagnetic layer and at least one anti-ferromagnetic layer.

3. The structure of claim 1 wherein the biasing multilayer element comprises at least one pinned soft ferromagnetic layer and at least one anti-ferromagnetic layer separated by a spacer layer.

4. The structure of claim 1 wherein the biasing multilayer element comprises two anti-ferromagnetic layers separated by a pinned soft ferromagnetic layer.

5. A magnetoresistive sensor comprising:
   a magnetic sensing portion;
   a biasing multilayer element having a first end coupled to the magnetic sensing portion and having a second end, wherein at least two layers of the multilayer element are substantially perpendicular to the first end and the second end; and
   a hard bias element adjacent to the second end of the biasing multilayer element and spaced from the magnetic sensing portion.

6. The magnetoresistive sensor of claim 5 wherein a spacer layer separates the biasing multilayer element from the hard bias element.

7. The magnetoresistive sensor of claim 5 wherein the biasing multilayer element comprises at least one pinned soft ferromagnetic layer and at least one anti-ferromagnetic layer.

8. The magnetoresistive sensor of claim 7 wherein the pinned soft ferromagnetic layer is separated from the anti-ferromagnetic layer by a spacer layer.

9. The magnetoresistive sensor of claim 5 wherein the biasing multilayer element comprises two anti-ferromagnetic layers separated by a pinned soft ferromagnetic layer.

10. The magnetoresistive sensor of claim 5 wherein the magnetic sensing portion comprises a free layer and a pinned layer.

11. The magnetoresistive sensor of claim 5 wherein the magnetic sensing portion comprises free layer and a synthetic antiferromagnet (SAF) structure.

12. A magnetoresistive sensor comprising:
   a magnetic sensing layer having a center region, a first end region and a second end region;
   a first pinned soft ferromagnetic bias layer having an inner end abutting the first end region and having an outer end;
   a first pinning layer adjacent the first pinned soft ferromagnetic bias layer;
   a first permanent magnet adjacent an outer end of the first pinned soft ferromagnetic bias layer and spaced from the first end region;
   a second pinned soft ferromagnetic bias layer having an inner end abutting the second end region and having an outer end;
   a second pinning layer adjacent the second pinned soft ferromagnetic bias layer; and
   a second permanent magnet adjacent an outer end of the second pinned soft ferromagnetic bias layer and spaced from the second end region.

13. The magnetoresistive sensor of claim 12 and further comprising:
   a first spacer layer separating the outer end of the first pinned soft ferromagnetic bias layer from the first permanent magnet; and
   a second spacer layer separating the outer end of the second pinned soft ferromagnetic bias layer from the second permanent magnet.

14. The magnetoresistive sensor of claim 12 and further comprising:
   a third pinning layer adjacent to the first pinned soft ferromagnetic bias layer and spaced from the first pinning layer; and
   a fourth pinning layer adjacent to the second pinned soft ferromagnetic bias layer and spaced from the second pinning layer.

15. A structure for stabilizing a magnetic sensor having a central region, the structure comprising:
   a biasing multilayer element having a first end and a second end, wherein the first end abuts the central region;
   a hard bias element adjacent to the second end of the biasing multilayer element and spaced from the central region; and
   a spacer layer separating the second end of the biasing multilayer element from the hard bias element.

16. The structure of claim 15 wherein the biasing multilayer element comprises at least one pinned soft ferromagnetic layer and at least one anti-ferromagnetic layer.

17. The structure of claim 15 wherein the biasing multilayer element comprises at least one pinned soft ferromagnetic layer and at least one anti-ferromagnetic layer separated by a spacer layer.

18. The structure of claim 15 wherein the biasing multilayer element comprises two anti-ferromagnetic layers separated by a pinned soft ferromagnetic layer.

19. A structure for stabilizing a magnetic sensor having a central region, the structure comprising:
   a biasing multilayer element having a first end and a second end, wherein the first end abuts the central region, the biasing multilayer element comprising at least one pinned soft ferromagnetic layer and at least one anti-ferromagnetic layer separated by a spacer layer;
   a hard bias element adjacent to the second end of the biasing multilayer element and spaced from the central region.

20. The structure of claim 19 wherein a spacer layer separates the biasing multilayer element from the hard bias element.

* * * * *